(12) United States Patent
Liu

(10) Patent No.: US 10,319,933 B2
(45) Date of Patent: Jun. 11, 2019

(54) OLED DEVICE AND MANUFACTURING METHOD THEREOF, AND FLEXIBLE DISPLAY UNIT

(71) Applicant: Wuhan China Star Optoelectronics Technology Co., Ltd., Wuhan, Hubei (CN)

(72) Inventor: Zhe Liu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 244 days.

(21) Appl. No.: 15/100,345

(22) PCT Filed: Apr. 8, 2016

(86) PCT No.: PCT/CN2016/078791
§ 371 (c)(1),
(2) Date: May 31, 2016

(87) PCT Pub. No.: WO2017/161605
PCT Pub. Date: Sep. 28, 2017

(65) Prior Publication Data
US 2018/0123079 A1    May 3, 2018

(30) Foreign Application Priority Data

Mar. 23, 2016  (CN) .......................... 2016 1 0171021

(51) Int. Cl.
*H01L 51/52* (2006.01)
*H01L 51/56* (2006.01)
(Continued)

(52) U.S. Cl.
CPC ...... *H01L 51/5209* (2013.01); *H01L 27/3244* (2013.01); *H01L 51/0022* (2013.01);
(Continued)

(58) Field of Classification Search
CPC .......... H01L 51/00; H01L 51/52; H01L 27/32
(Continued)

(56) References Cited

U.S. PATENT DOCUMENTS

2001/0026123 A1\* 10/2001 Yoneda ............... H01L 27/3244
313/504
2004/0079941 A1\* 4/2004 Yamazaki ........... H01L 27/1218
257/40
(Continued)

*Primary Examiner* — Sheikh Maruf
(74) *Attorney, Agent, or Firm* — Andrew C. Cheng

(57) ABSTRACT

The invention discloses an OLED device including: a flexible substrate; a first anode and a second anode on the flexible substrate and being spaced from each other to form a channel therebetween; a flexible electrically-conductive assembly in the channel and connecting the first anode with the second anode; a first organic light emitting layer on the first anode and a second organic light emitting layer on the second anode; and a cathode on the first and the second organic light emitting layers. The invention can improve the flexibility of the anode of the OLED device, reduce an actual continuous length of the anode on a bending direction, reduce the probability of crack generation in the process of the OLED device being bent by external force, and therefore can increase bendable and wearable abilities of a flexible OLED display device formed by such OLED device.

6 Claims, 3 Drawing Sheets

(51) Int. Cl.
*H01L 27/32* (2006.01)
*H01L 51/00* (2006.01)
(52) U.S. Cl.
CPC .......... *H01L 51/0097* (2013.01); *H01L 51/52* (2013.01); *H01L 51/56* (2013.01); *H01L 27/3276* (2013.01); *H01L 2251/30* (2013.01); *H01L 2251/301* (2013.01); *H01L 2251/308* (2013.01); *H01L 2251/5338* (2013.01); *Y02E 10/549* (2013.01)

(58) Field of Classification Search
USPC .............................................. 257/40; 438/99
See application file for complete search history.

(56) References Cited

U.S. PATENT DOCUMENTS

| | | | | |
|---|---|---|---|---|
| 2004/0164292 A1* | 8/2004 | Tung | ................. | G02F 1/133603 257/40 |
| 2007/0030571 A1* | 2/2007 | Yeh | .................. | G02F 1/133555 359/630 |
| 2007/0069212 A1* | 3/2007 | Saitoh | .................... | B82Y 10/00 257/59 |
| 2007/0126339 A1* | 6/2007 | Kato | ....................... | H01J 9/148 313/496 |
| 2008/0111126 A1* | 5/2008 | Kim | ..................... | H01L 27/3272 257/40 |
| 2008/0170982 A1* | 7/2008 | Zhang | .................... | B82Y 10/00 423/447.3 |
| 2008/0231165 A1* | 9/2008 | Lee | ........................ | H01J 29/92 313/495 |
| 2009/0195150 A1* | 8/2009 | Chen | ................. | G02F 1/133305 313/504 |
| 2010/0103121 A1* | 4/2010 | Kim | .................... | G02F 1/13394 345/173 |
| 2010/0133569 A1* | 6/2010 | Li | .......................... | B82Y 20/00 257/98 |
| 2010/0157585 A1* | 6/2010 | Diekmann | .............. | F21S 6/002 362/228 |
| 2010/0261321 A1* | 10/2010 | Hirano | ................ | H01L 51/0097 438/158 |
| 2012/0175606 A1* | 7/2012 | Wei | ........................ | B82Y 30/00 257/43 |
| 2014/0091284 A1* | 4/2014 | Feng | .................... | H01L 51/5203 257/40 |
| 2015/0001474 A1* | 1/2015 | Park | .................... | H01L 51/5271 257/40 |
| 2015/0115253 A1* | 4/2015 | Ha | ....................... | H01L 27/3248 257/40 |
| 2015/0160511 A1* | 6/2015 | Kim | .................. | G02F 1/133553 349/43 |
| 2015/0263235 A1* | 9/2015 | Shin | ........................ | H01L 33/38 257/72 |
| 2016/0049608 A1* | 2/2016 | Hack | ....................... | H01L 51/56 257/40 |
| 2016/0141528 A1* | 5/2016 | Masuyama | .......... | G02B 5/1814 257/40 |
| 2016/0233447 A1* | 8/2016 | Kim | .................... | A61B 5/6826 |
| 2017/0012089 A1* | 1/2017 | Kim | .................... | H01L 27/3244 |
| 2017/0139513 A1* | 5/2017 | Hong | .................. | G02B 26/005 |
| 2017/0153368 A1* | 6/2017 | Yoon | ................. | G02F 1/133512 |
| 2017/0155092 A1* | 6/2017 | Seo | ..................... | H01L 51/5265 |
| 2017/0186829 A1* | 6/2017 | Yamazaki | .......... | H01L 27/3262 |
| 2017/0213877 A1* | 7/2017 | Seo | ..................... | H01L 27/3213 |
| 2017/0256743 A1* | 9/2017 | Uesaka | ................ | H01L 51/5265 |
| 2018/0047902 A1* | 2/2018 | Yasumoto | ............ | H01L 51/003 |
| 2018/0183000 A1* | 6/2018 | Nagao | ................ | H01L 51/56 |

\* cited by examiner

OLED DEVICE AND MANUFACTURING METHOD THEREOF, AND FLEXIBLE DISPLAY UNIT

TECHNICAL FIELD

The invention relates to the field of semiconductor technology, and more particularly to an OLED (Organic Light Emitting Diode) device and a manufacturing method thereof, and further a flexible display unit.

DESCRIPTION OF RELATED ART

In the flexible display technology, how to improve the flexibility of respective parts of a flexible display device and avoid the failure of device caused by broken or irreversible deformation of a certain portion in the process of the flexible display device being bent, flexed or squeezed are prerequisite to ensure successful application of the flexible display device.

Especially in the flexible OLED display panel, one of keys is to prevent cracks resulting from uneven stress occurred on some rigid layers of the flexible OLED display panel when encountering excessively large bending radius of curvature. Usually, in the flexible OLED display panel, anodes of OLED devices usually are composed of a transparent electrically-conductive oxide such as indium tin oxide (ITO). The flexibility of these electrically-conductive oxide films is lower than that of the other organic films in the OLED devices, it is easier to crack at the anodes in the process of the OLED devices being subjected to the bending of external force, which would cause brightness of a display pixel constituted by such OLED device to be reduced or even failure.

SUMMARY

In order to solve the problems existed in the prior art, an objective of the invention is to provide an OLED device. In particular, the OLED device includes: a flexible substrate; a first anode and a second anode formed on the flexible substrate, wherein the first anode and the second anode are spaced from each other to form/define a channel therebetween; a flexible electrically-conductive assembly in the channel, wherein the flexible electrically-conductive assembly electrically connects the first anode with the second anode; a first organic light emitting layer on the first anode and a second organic light emitting layer on the second anode; a planarization insulating layer on the flexible electrically-conductive assembly; and a cathode on the first organic light emitting layer, the second organic light emitting layer and the planarization insulating layer.

Further, the flexible electrically-conductor assembly includes a plurality of electrically-conductive nanowires, wherein the plurality of electrically-conductive nanowires are arranged in an array in the channel, and each of the plurality of electrically-conductive nanowires connects the first anode with the second anode.

Still further, each of the electrically-conductive nanowires is made of silver or a metallic carbon nanotube.

Another objective of the invention is to provide a manufacturing method of an OLED device. The manufacturing method includes steps of: providing a flexible substrate; forming a first anode and a second anode spaced from each other on the flexible substrate, wherein a spacing between the first anode and the second anode defines a channel; forming a flexible electrically-conductive assembly in the channel, wherein the flexible electrically-conductive assembly connects the first anode with the second anode; forming a first organic light emitting layer and a second organic light emitting layer respectively on the first anode and the second anode; forming a planarization insulating layer on the flexible electrically-conductive assembly; and forming a cathode on the first organic light emitting layer, the second organic light emitting layer and the planarization insulating layer.

Further, a concrete method of forming a flexible electrically-conductive assembly includes: coating a photoresist layer covering the first anode, the second anode and the channel; using exposure and developing methods to remove the photoresist layer in the channel to expose the channel; printing a flexible electrically-conductive assembly on the remaining photoresist layer as well as in the channel; removing the remaining photoresist layer and the flexible electrically-conductive assembly on the remaining photoresist layer, and meanwhile retaining/maintaining the flexible electrically-conductive assembly in the channel.

Still further, a roll-to-roll printing method or a direct contact printing method is used to from a plurality of electrically-conductive nanowires arranged in an array on the remaining photoresist layer as well as in the channel as the flexible electrically-conductive assembly.

Still another objective of the invention is to provide a flexible display unit. The flexible display unit includes: a flexible substrate; a buffer layer on the flexible substrate; a switching element on the buffer layer, wherein the switching element at least includes a control electrode, an input electrode and an output electrode; a first planarization layer on the buffer layer and covering the switching element; a first anode and a second anode on the first planarization layer, wherein the first anode and the second anode are spaced from each other to define/form a channel therebetween, the first anode penetrates through the first planarization layer to connect the output electrode of the switching element; a flexible electrically-conductive assembly in the channel, wherein the flexible electrically-conductive assembly connects the first anode with the second anode; a second planarization layer covering the first anode, the second anode and the flexible electrically-conductor assembly; a first organic light emitting layer and a second organic light emitting layer in the second planarization layer, wherein the first organic light emitting layer is in contact with the first anode, and the second organic light emitting layer is in contact with the second anode; and a cathode on the second planarization layer and being in contact with both the first organic light emitting layer and the second organic light emitting layer.

Beneficial effects can be achieved by the invention are that the invention can improve the flexibility of the anode of an OLED device, reduce an actual continuous length of the anode in a bending direction, reduce the probability of crack generation in the process of the OLED device being bent by external force, and therefore can increase bendable and wearable abilities of a flexible OLED display device formed by such OLED device.

BRIEF DESCRIPTION OF THE DRAWINGS

The above and other aspects, features and advantages of embodiments of the invention will be more apparent from the following detailed description taken in conjunction with the accompanying drawings, in which.

DETAILED DESCRIPTION OF EMBODIMENTS

Figure 1:
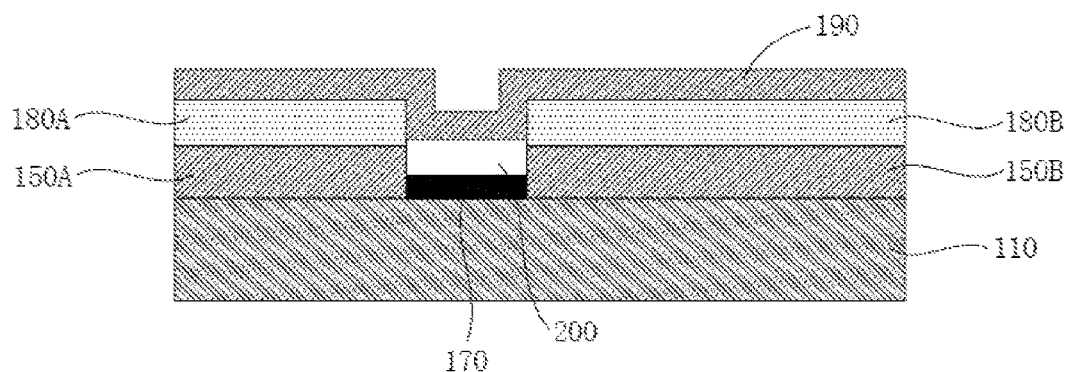
FIG. 1 is a schematic side view of an OLED device according to an embodiment of the invention.

In the following, various embodiments of the invention will be described in detail with reference to accompanying drawings. The invention may be embodied in many different forms and should not be construed as limiting to the embodiments set forth herein. Rather, these embodiments are provided to explain the principles of the invention and its practical applications, so that other skilled in the art can understand various embodiments of the invention and various modifications suitable for specific intended applications.

In the drawings, in order to make various elements/components be clear, thicknesses of respective layers and areas are exaggerated. Moreover, the same reference numeral always represents the same component in the drawings.

It is understood that, although the terminologies "first" and "second" can be used herein to describe various components, these components should not be limited by these terminologies. These terminologies are only used to distinguish one component from another component.

It also can be understand that, when one layer or component is referred to as being or formed "on" or "under" another layer or a substrate, it may be directly formed on or under the another layer or the substrate, or have an intermediate layer(s) or an intermediate component(s) existed therebetween.

Figure 2:
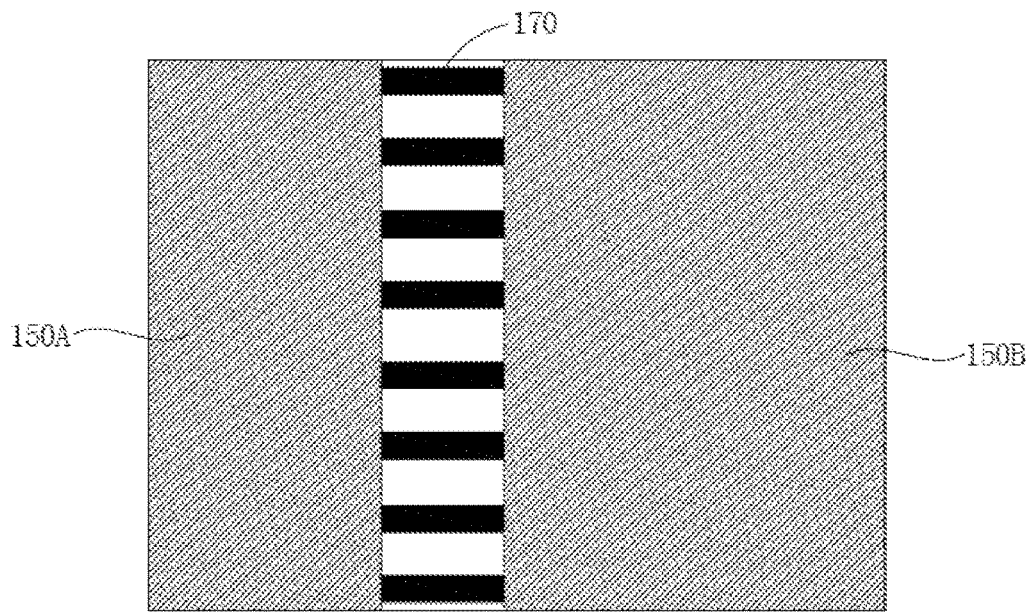
FIG. 2 is a schematic top view of the OLED device according to the embodiment of the invention.
Figure 3:
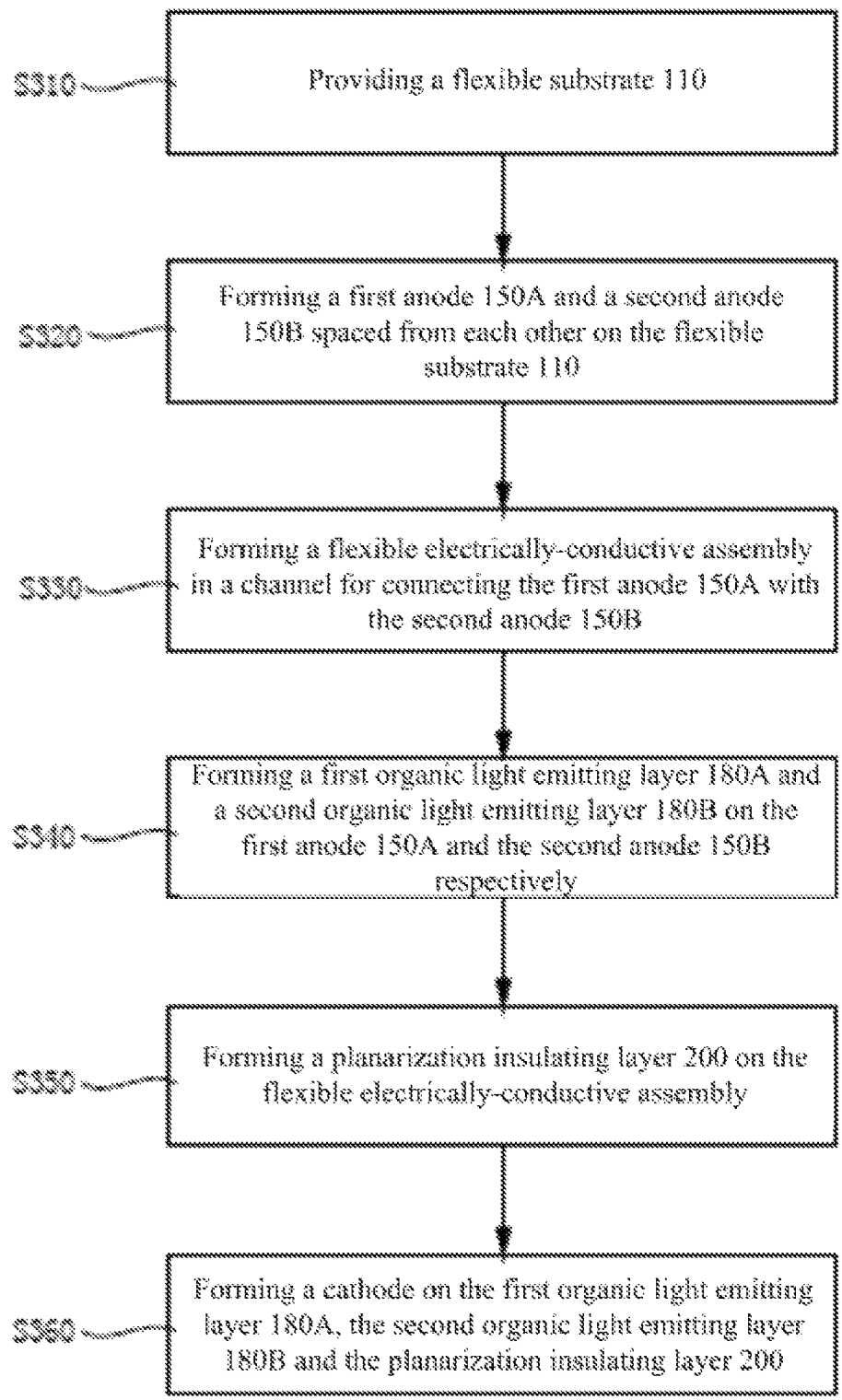
FIG. 3 is a flowchart of a manufacturing method of the OLED device according to an embodiment of the invention.

FIG. 1 is a schematic side view of an OLED device according to an embodiment of the invention. FIG. 2 is a schematic top view of the OLED device according to the embodiment of the invention. FIG. 3 is a flowchart of a manufacturing method of the OLED device according to an embodiment of the invention. In FIG. 2, for convenience of illustration, some elements/components have been shown in FIG. 1 are not illustrated.

Referring to FIG. 1 through FIG. 3, in step 310, a flexible substrate 110 is provided. Herein, the flexible substrate 110 may be made of a suitable flexible material such as polyethylene terephthalate (PET) or polyethylene naphthalate (PEN), but the invention is not limited to this.

In step 320, a first anode 150A and a second anode 150B spaced from each other are formed the flexible substrate 110. Herein, a spacing between the first anode 150A and the second anode 150B defines a channel (no labelled), and the effect of the channel will be described below.

In the illustrated embodiment, the first anode 150A and the second anode 150B may be simultaneously formed or not simultaneously formed, the invention is not particularly limited. The first anode 150A and the second anode 150B both can be made of indium tin oxide (ITO), but the invention is not limited to this.

In step 330, a flexible electrically-conductive assembly is formed in the channel for connecting the first anode 150A with the second anode 150B. In the illustrated embodiment, the flexible electrically-conductive assembly includes multiple (i.e., more than one) electrically-conductive nanowires 170 arranged in an array. Each of the electrically-conductive nanowires 170 connects the first anode 150A with the second anode 150B, so as to make the first anode 150A and the second anode 150B be electrically connected/communicated with each other.

Furthermore, the conductive nanowire 170 may be made of an electrically-conductive metal (such as silver, gold) or a metallic carbon nanotube, but the invention is not limited to this.

In addition, a concrete method for forming the flexible electrically-conductive assembly for connecting the first anode 150A with the second anode 150B in the channel may include: firstly, coating a photoresist (not shown) covering the first anode 150A, the second anode 150B and the channel; subsequently, using exposure and developing methods to remove the photoresist layer in the channel so as to expose the channel; then, printing a flexible electrically-conductive assembly on the remaining photoresist layer as well as in the channel; and finally, removing the remaining photoresist layer and the flexible conductive assembly on the remaining photoresist layer, and meanwhile maintaining the flexible electrically-conductive assembly in the channel.

Furthermore, a concrete method for printing a flexible electrically-conductive assembly on the remaining photoresist layer as well as in the channel may be that: using a roll-to-roll printing method or a direct contact printing method to form multiple electrically-conductive nanowires 170 arranged in an array on the remaining photoresist layer as well as in the channel, so as to form the flexible electrically-conductive assembly.

In step 340, a first organic light emitting layer 180A and a second organic light emitting layer 180B are formed on the first anode 150A and the second anode 150B respectively. Herein, the first organic light emitting layer 180A and the second organic light emitting layer 180B may emit lights of same color or lights of different colors, the invention is not particularly limited.

In step 350, a planarization insulating layer 200 is formed on the flexible electrically-conductive assembly.

In step 360, a cathode 190 is formed on the first organic light emitting layer 180A, the second organic light emitting layer 180B and the planarization insulating layer 200. A thickness of the planarization insulation layer 200 is needed to ensure that the cathode 190 is not in contact with the first anode 150A and the second anode 150B. In the illustrated embodiment, the cathode layer 110 may be made of an electrically-conductive metal, but the invention is not limited to this.

In summary, in the channel, by using a flexible electrically-conductive assembly constituted by a plurality of electrically-conductive nanowires 170 arranged in an array to connect the first anode 150A with the second anode 150B, the capability of the anode going against tension or pressure generated in the process of external bending is improved, damage to the anode caused by uneven stress is reduced, an actual continuous length of the anode in a bending direction meanwhile is reduced, and the probability of crack generation in the course of the OLED device being bent by an external force is reduced, and therefore bendable and wearable abilities of flexible OLED display device are improved.

Figure 4:
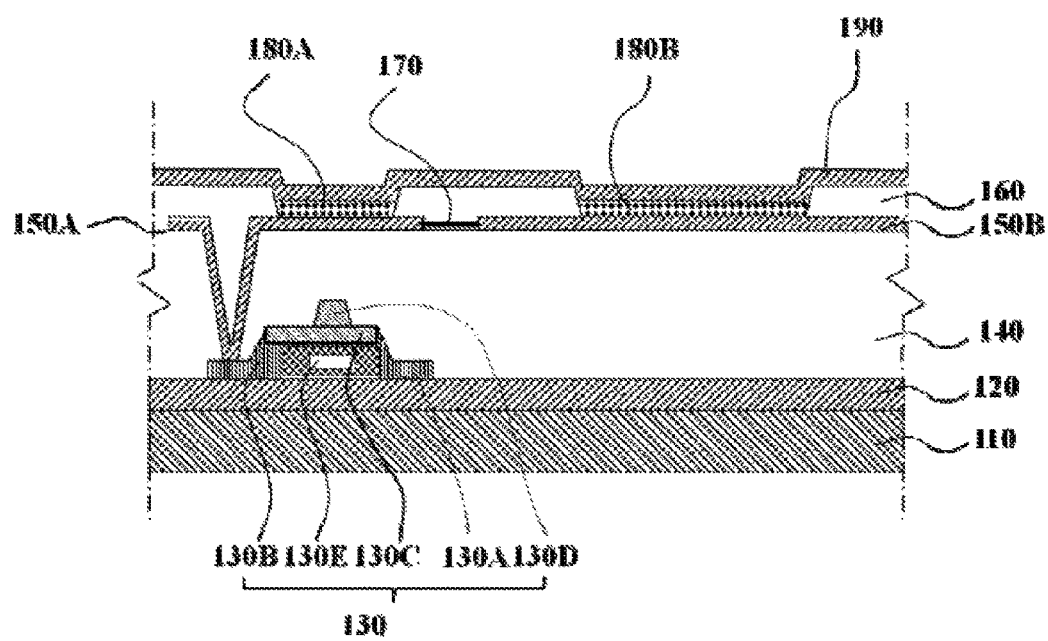
FIG. 4 is a schematic side view of a flexible OLED display unit according to an embodiment of the invention.
Figure 5:
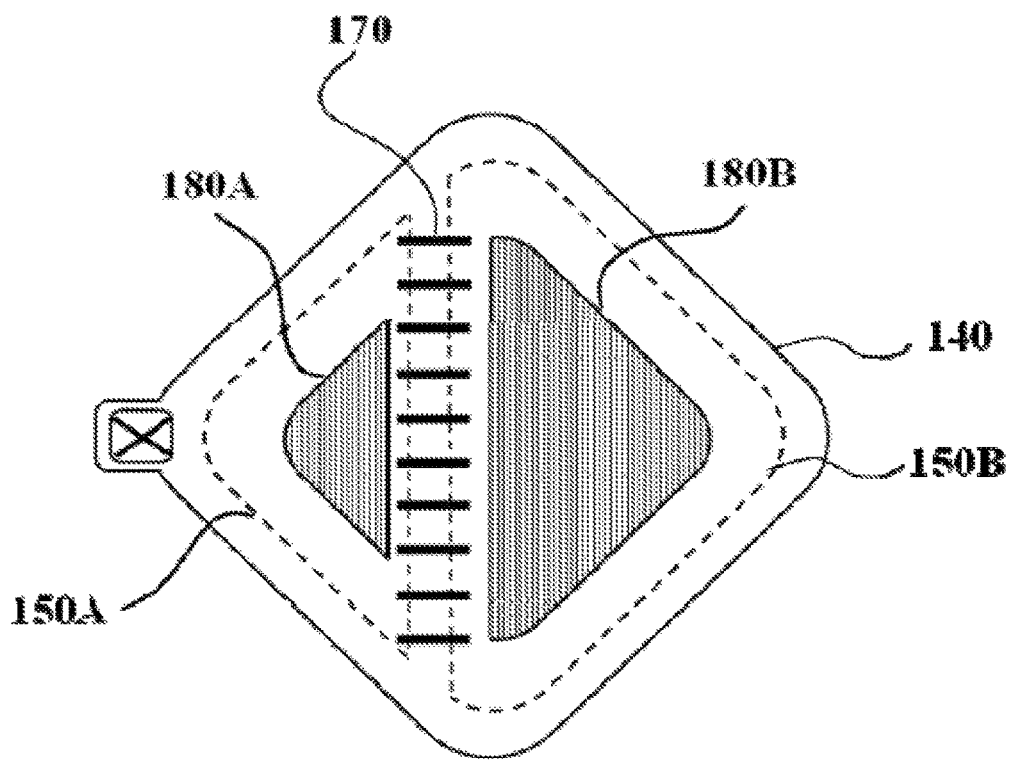
FIG. 5 is a schematic top view of the flexible OLED display unit according to the embodiment of the invention.

FIG. 4 is a schematic side view of a flexible OLED display unit according to an embodiment of the invention. FIG. 5 is a schematic top view of the flexible OLED display unit according to the embodiment of the invention; In FIG. 5, for convenience of illustration, some of the components have been shown in FIG. 4 are not illustrated again.

Referring to FIG. 4, the flexible OLED display unit according to the embodiment of the invention includes:

a flexible substrate 110;

a buffer layer 120 on the flexible substrate 110;

a switching element 130 on the buffer layer 120, wherein the switching element 130 at least includes a control electrode 130D, an input electrode 130A and an output electrode 130B;

a first planarization layer 140 on the buffer layer 120 and covering the switching element 130;

a first anode 150A and a second anode 150B on the first planarization layer 140, wherein the first anode 150A and the second anode 150B are spaced from each other to form a channel therebetwwen, the first anode 150A penetrates through the first planarization layer 140 to connect the output electrode 130B of the switching element 130;

a flexible electrically-conductive assembly in the channel for connecting the first anode 150A with the second anode 150B, wherein the flexible electrically-conductive assembly includes a plurality of electrically-conductive nanowires 170 arranged in an array in the channel, each of the electrically-conductive nanowires 170 connects the first anode 150A with the second anode 150B to make the first anode 150A and the second anode 150B be electrically connected/communicated with each other;

a second planarization layer 160 covering the first anode 150A, the second anode 150B and the flexible electrically-conductive assembly;

a first organic light emitting layer 180A and a second organic light emitting layer 180B in the second planarization layer 160, wherein the first organic light emitting layer 180A is in contact with the first anode 150A, and the second organic light emitting layer 180B is in contact with the second anode 150B; and a cathode 190 on the second planarization layer 160 and in contact with the first organic light emitting layer 180A as well as the second organic light emitting layer 180B.

In the illustrated embodiment, the switching element 130 may be a thin film transistor (TFT), but the invention is not limited to this. Herein, the control electrode 130D, the input electrode 130A and the output electrode 130B of the switching element 130 respectively are a gate, a source and a drain of the thin film transistor. In addition, the switching element 130 further includes an active layer 130E, a gate insulation layer 130C and the other necessary components.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An organic light emitting diode (OLED) device comprising:

a flexible substrate;

a first anode and a second anode on the flexible substrate, wherein the first anode and the second anode are spaced from each other to form a channel therebetween;

a flexible electrically-conductive assembly in the channel, wherein the flexible electrically-conductive assembly electrically connects the first anode with the second anode so that the first anode and the second anode are electrically connected to each other;

a first organic light emitting layer on the first anode and a second organic light emitting layer on the second anode;

a planarization insulating layer on the flexible electrically-conductive assembly; and a cathode on the first organic light emitting layer, the second organic light emitting layer and the planarization insulating layer;

wherein the first anode, the flexible electrically-conductive assembly, and the second anode are provided on a common plane defined by a surface of the flexible substrate and the first anode and the second anode are electrically connected to each other with the flexible electrically-conductive assembly such that the first organic light emitting layer and the second organic light emitting layer are connected in parallel to each other and are energizable simultaneously through the first and second anodes being electrically connected to each other with the flexible electrically-conductive assembly.

2. The OLED device according to claim 1, wherein the flexible electrically-conductive assembly comprises a plurality of electrically-conductive nanowires, the plurality of electrically-conductive nanowires arranged in an array in the channel, and each of the plurality of electrically-conductive nanowires connects the first anode with the second anode.

3. The OLED device according to claim 2, wherein the plurality of electrically-conductive nanowires are made of silver or a metallic carbon nanotube.

4. A flexible display unit comprising:

a flexible substrate;

a buffer layer on the flexible substrate;

a switching element on the buffer layer, wherein the switching element at least comprises a control electrode an input electrode and an output electrode;

a first planarization layer on the buffer layer and covering the switching element;

a first anode and a second anode on the first planarization layer, wherein the first anode and the second anode are spaced from each other to form a channel therebetween, the first anode penetrates through the first planarization layer to connect the output electrode of the switching element;

a flexible electrically-conductive assembly in the channel, wherein the flexible electrically-conductive assembly connects the first anode with the second anode so that the first anode and the second anode are electrically connected to each other;

a second planarization layer covering the first anode, the second anode, and the flexible electrically-conductive assembly;

a first organic light emitting layer and a second organic light emitting layer in the second planarization layer, wherein the first organic light emitting layer is in contact with the first anode, and the second organic light emitting layer is in contact with the second anode; and a cathode on the second planarization layer and being in contact with both the first organic light emitting layer and the second organic light emitting layer;

wherein the first anode, the flexible electrically-conductive assembly, and the second anode are provided on a common plane defined by a surface of the flexible substrate and the first anode and the second anode are electrically connected to each other with the flexible electrically-conductive assembly such that the first organic light emitting layer and the second organic light emitting layer are connected in parallel to each other and are energizable simultaneously through the first and second anodes being electrically connected to each other with the flexible electrically-conductive assembly.

5. The flexible display unit according to claim 4, wherein the flexible electrically-conductive assembly comprises a plurality of electrically-conductive nanowires, the plurality of electrically-conductive nanowires are arranged in an array in the channel, and each of the plurality of electrically-conductive nanowires connects the first anode with the second anode.

6. The flexible display unit according to claim 5, wherein each of the plurality of electrically-conductive nanowires is made of sliver or a metallic carbon nanotube.

* * * * *